US006250758B1

(12) United States Patent
Yoshihara et al.

(10) Patent No.: US 6,250,758 B1
(45) Date of Patent: Jun. 26, 2001

(54) PLASTIC OPTICAL DEVICES HAVING ANTIREFLECTION FILM AND MECHANISM FOR EQUALIZING THICKNESS OF ANTIREFLECTION FILM

(75) Inventors: Masaaki Yoshihara; Hitoshi Kamura; Hajime Kamiya, all of Tokyo (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 09/230,031

(22) PCT Filed: May 18, 1998

(86) PCT No.: PCT/JP98/02177

§ 371 Date: Apr. 1, 1999

§ 102(e) Date: Apr. 1, 1999

(87) PCT Pub. No.: WO98/52074

PCT Pub. Date: Nov. 19, 1998

(30) Foreign Application Priority Data

| May 16, 1997 | (JP) | 9-143173 |
| May 16, 1997 | (JP) | 9-143175 |
| May 16, 1997 | (JP) | 9-143180 |
| Jun. 13, 1997 | (JP) | 9-173096 |
| Jun. 13, 1997 | (JP) | 9-173098 |

(51) Int. Cl.$^7$ ............... G02C 7/10; G02B 1/10; G02B 5/28

(52) U.S. Cl. .......... 351/163; 351/166; 351/177; 359/588; 359/589

(58) Field of Search ................ 359/586, 587, 359/588, 589; 351/166, 163, 177

(56) References Cited

U.S. PATENT DOCUMENTS

| 4,609,267 | * | 9/1986 | Deguchi et al. ............ 351/163 |
| 5,923,471 | * | 7/1999 | Wood, II et al. ............ 359/588 |

FOREIGN PATENT DOCUMENTS

| 56-66802 | 6/1981 | (JP) . |
| 56-113101 | 9/1981 | (JP) . |
| 57-124301 | 8/1982 | (JP) . |
| 58-107484 | 6/1983 | (JP) . |
| 60-64301 | 4/1985 | (JP) . |
| 62-73202 | 4/1987 | (JP) . |
| 63-217302 | 9/1988 | (JP) . |
| 2-58002 | 2/1990 | (JP) . |
| 3-102301 | 4/1991 | (JP) . |
| 4-81802 | 3/1992 | (JP) . |
| 4-202773 | 7/1992 | (JP) . |
| 4-221061 | 8/1992 | (JP) . |
| 5-295538 | 11/1993 | (JP) . |
| 6-192835 | 7/1994 | (JP) . |
| 7-173620 | 7/1995 | (JP) . |
| 8-75902 | 3/1996 | (JP) . |

* cited by examiner

Primary Examiner—Scott J. Sugarman
(74) Attorney, Agent, or Firm—Oliff & Berridge, PLC

(57) ABSTRACT

Plastic optical devices in which an antireflection film (13) is coated on the surface of a plastic base material (10). The antireflection film (13) is a multi-layered film which is formed by depositing a first layer (131) on the side of the plastic base material substantially by a high-refractive material and the next layer (132) by a low-refractive material, and by alternately laminating those high-refractive materials and low-refractive materials. The surface of the optical lens base material (10) has curvature and a plurality of the optical lens base materials (10) are disposed horizontally at the positions of concentric circles in a circular plate holder (26) which is placed horizontally and is rotatable. A sputtering film deposition system comprises targets (31) facing to the surfaces of the optical lens base materials (10). Thickness correcting plates function as mask members (51, 52) for regulating the difference of film thickness disposed in the direction connecting the peripheral part and the center part in the holder and between the targets (31) and the holder (26).

19 Claims, 10 Drawing Sheets

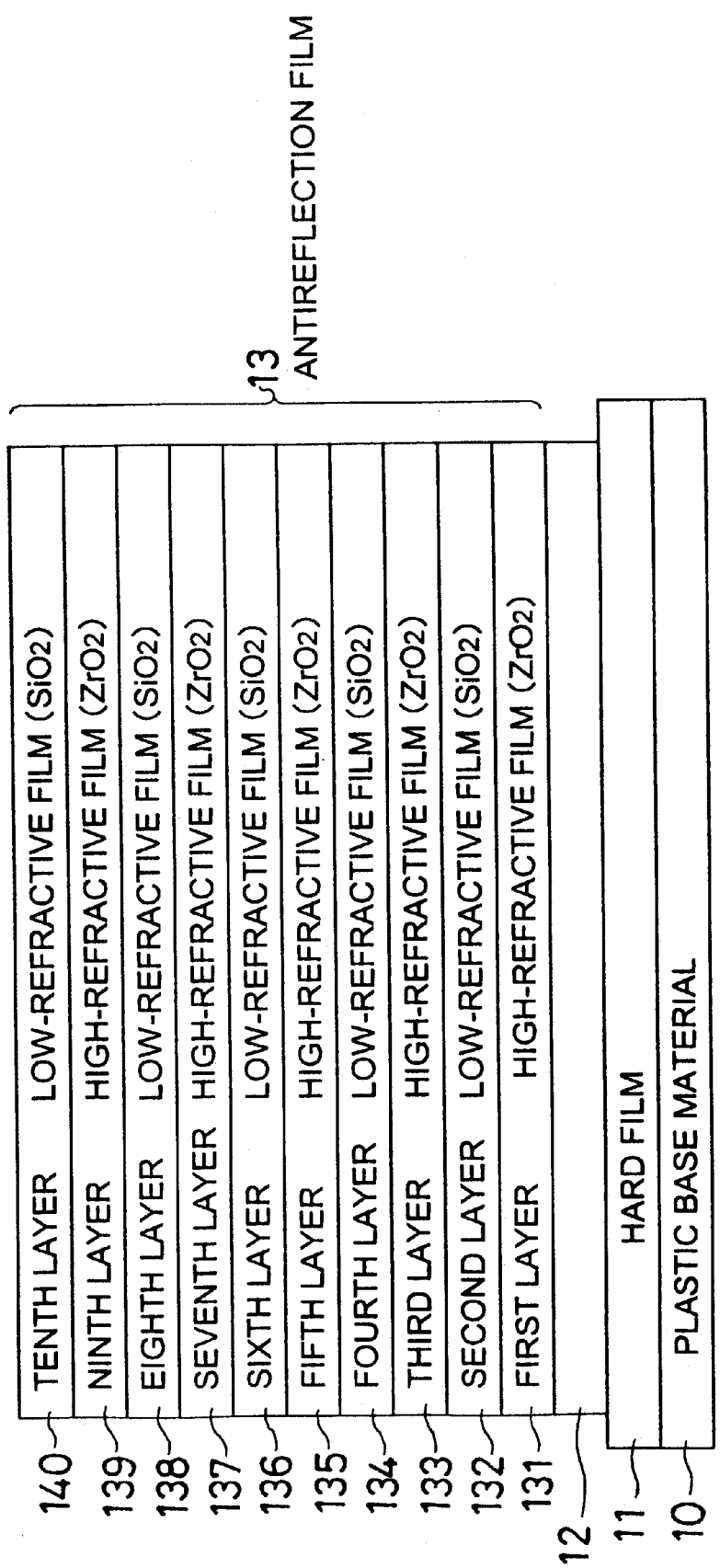

FIG. 5(A)

| | ATMOSPHERE SIDE |
|---|---|
| 10 | SiO2 FILM THICKNESS 0.26 λ |
| 9 | ZrO2 FILM THICKNESS 0.29 λ |
| 8 | SiO2 FILM THICKNESS 0.05 λ |
| 7 | ZrO2 FILM THICKNESS 0.11 λ |
| 6 | SiO2 FILM THICKNESS 0.49 λ |
| 5 | ZrO2 FILM THICKNESS 0.11 λ |
| 4 | SiO2 FILM THICKNESS 0.11 λ |
| 3 | ZrO2 FILM THICKNESS 0.19 λ |
| 2 | SiO2 FILM THICKNESS 0.12 λ |
| 1 | ZrO2 FILM THICKNESS 0.08 λ |

13 { (layers 1–10)
12 — SiO(2-X) FILM THICKNESS 15 Å
11 — HARD FILM
10 — PLASTIC BASE MATERIAL

FIG. 5(B)

| | ATMOSPHERE SIDE |
|---|---|
| 10 | SiO2 FILM THICKNESS 0.26 λ |
| 9 | ZrO2 FILM THICKNESS 0.29 λ |
| 8 | SiO2 FILM THICKNESS 0.05 λ |
| 7 | ZrO2 FILM THICKNESS 0.11 λ |
| 6 | SiO2 FILM THICKNESS 0.49 λ |
| 5 | ZrO2 FILM THICKNESS 0.11 λ |
| 4 | SiO2 FILM THICKNESS 0.11 λ |
| 3 | ZrO2 FILM THICKNESS 0.19 λ |
| 2 | SiO2 FILM THICKNESS 0.12 λ |
| 1 | ZrO2 FILM THICKNESS 0.08 λ |

13 { (layers 1–10)
12a — SiO(2-X) FILM THICKNESS 80 Å
11 — HARD FILM
10 — PLASTIC BASE MATERIAL

FIG. 5(C)

| | ATMOSPHERE SIDE |
|---|---|
| 10 | SiO2 FILM THICKNESS 0.26 λ |
| 9 | ZrO2 FILM THICKNESS 0.29 λ |
| 8 | SiO2 FILM THICKNESS 0.05 λ |
| 7 | ZrO2 FILM THICKNESS 0.11 λ |
| 6 | SiO2 FILM THICKNESS 0.49 λ |
| 5 | ZrO2 FILM THICKNESS 0.11 λ |
| 4 | SiO2 FILM THICKNESS 0.11 λ |
| 3 | ZrO2 FILM THICKNESS 0.19 λ |
| 2 | SiO2 FILM THICKNESS 0.12 λ |
| 1 | ZrO2 FILM THICKNESS 0.08 λ |

13 { (layers 1–10)
11 — HARD FILM
10 — PLASTIC BASE MATERIAL

PLASTIC OPTICAL DEVICES HAVING ANTIREFLECTION FILM AND MECHANISM FOR EQUALIZING THICKNESS OF ANTIREFLECTION FILM

TECHNICAL FIELD

The present invention relates to a technology for depositing an antireflection film whose film performance is highly evaluated on the surface of plastic optical devices by means of a sputtering method, to a technology for preventing cracks from occurring on the antireflection film when the plastic optical devices are used as a spectacles plastic lens and to a technology for equalizing the thickness of the thin film deposited by means of the sputtering method.

BACKGROUND ART

Plastics are often used as a material of spectacles lenses lately from the aspect of being light and excellent in shock resistance. Antireflection films are coated on both surfaces of the spectacles plastic lens. The antireflection film is provided to prevent surface reflection on the spectacles plastic lens because the surface reflection causes, when it occurs, the drop of light transmittance in the optical system, the increase of light which will not contribute in forming an image and the drop of contrast of the image. The antireflection film of the spectacles plastic lens has been conventionally formed as a single-layer film or a multi-layered film mainly by means of a vacuum evaporation method.

Presently, highly productive methods and systems for forming the antireflection film on an optical lens such as the spectacles plastic lens by the simple arrangement utilizing the sputtering method are being proposed. The sputtering film deposition system is provided with a sputtering film deposition chamber which allows different thin films to be fabricated by exchanging targets in a vacuum container for the chamber. The sputtering system allows a multi-layered antireflection film to be deposited on the surface of the spectacles plastic lens without exposing it to the atmosphere. It also allows the films to be deposited on the both sides of the spectacles plastic lens at the same time. The sputtering film deposition system has a merit that it can form the homogeneous films on the both sides of the lens because it can form the films on the both sides of the lens at the same time and film forming conditions are the same on the both sides of the lens. Further, when a multi-layered film is deposited on the surface of the lens and further the film is formed by laminating two kinds of films having different qualities repeatedly and alternately, for example, high-refractive materials and low-refractive materials the sputtering film deposition system has merits that it can form the multi-layered film readily and can control the thickness of each layer accurately because it just needs to prepare two targets corresponding to the material of each film within the sputtering film deposition chamber and to sputter by exchanging the targets. The antireflection film having highly evaluated film performance may be formed by accurately controlling the thickness of each layer.

Then, as for the antireflection film of the plastic optical devices such as the spectacles plastic lens fabricated by utilizing the aforementioned new film forming method and system utilizing sputtering, it becomes possible to propose the antireflection film having the new multi-layered structure and highly evaluated film performance.

An interference color is an important evaluation item in the evaluation of the film performance of the spectacles lens. The interference color is a color caused by interference of white light, and in case of the spectacles plastic lens on which the multi-layered antireflection film is formed, it is a color of reflected light caused by interference when the transparent thin films having different refractive indices are coated on the surface of the lens. The interference colors of the commercially available lens coated with the antireflection film are divided roughly into three colors of bluish, purplish and greenish colors in general. Although the greenish interference color, among them, excels eye-physiologically and aesthetically and in terms of commercial value in particular, the technology for stably giving this interference color has not been established yet because there have been various technological problems in terms of the selection of raw materials of the film, of setting of the thickness of the film, of the film forming conditions and others. However, the use of the above-mentioned sputtering method may allow this problem to be solved.

There has been another problem that when the high-refractive material is formed as the first layer of the antireflection film on the spectacles plastic base material which is an organic substance, the balance of stress at the interface changes due to water absorption (moisture absorption) and to pressure applied from the outside with an elapse of time and the antireflection film is liable to crack from the interface. For instance, when the spectacles plastic lens on which the multi-layered antireflection film, in which the high-refractive material is formed as the first layer, is fitted into an spectacles frame while it is squeezed by considerably strong force and is further caused to absorb water, there is a case when the spectacles plastic lens cracks from the edge portion thereof. The occurrence of cracks drops its commercial value as an spectacles lens. Accordingly, it has been required to think of measures for preventing the occurrence of cracks.

In depositing the film on the optical lens by the sputtering method presently proposed, normally a plurality of lens base materials (in unit of lot) are set on a circular plate holder (substrate holder or a lens tray) and the film depositing process is carried out per lot while turning the holder. While it is considered that the thickness of the film formed by the sputtering method is well distributed, it is required to have more accurate and uniform distribution of thickness in utilizing the sputtering method for forming a thin film of the optical lens. More strict uniformity is required with regard to the thickness especially when the antireflection film is to be formed on the surface of the optical lens by utilizing the sputtering method as described above. When the thickness of the antireflection film on the surface of the lens is not uniform, its reflection color varies, thus dropping the feeling of wearing and using the optical lens and the commercial value thereof.

Furthers, as for the surfaces of the optical lens, one surface thereof is formed to be a concave surface and the other surface to be a convex surface, having curvatures, respectively. According to the method of forming the antireflection film on the surfaces of the optical lens by utilizing the sputtering method, normally the optical lens is disposed horizontally on the holder and upper and lower targets are disposed so as to face to the both sides of the optical lens, respectively, to carry out the sputtering film deposition on the both sides at the same time. However, it is difficult to deposit the films on the surfaces so as to have uniform thickness because the both sides of the optical lens have the curvatures peculiar to each and therefore distances between the targets facing to the respective surfaces of the optical lens and each part on the surfaces are different.

Accordingly, it is an object of the present invention to provide plastic optical devices having an antireflection film whose film performance is highly evaluated and having a new multi-layered structure by fabricating an antireflection film by utilizing the sputtering method.

Also, when the above-mentioned plastic optical device is to be utilized for a spectacles plastic lens, it is arranged so as to give a greenish interference color stably on the lens to form the antireflection film which excels eye-physiologically and aesthetically and is highly valuable commercially.

Another object of the present invention is to provide a spectacles plastic lens having an antireflection film which is arranged so as to prevent occurrence of cracks by improving the surface of the plastic base material, when forming the multi-layered antireflection film on the spectacles plastic base material which is an organic substance by depositing a high-refractive material as a first layer.

A further object of the present invention is to provide a mechanism which can uniform distribution of thickness of a film on the surface of the optical lens base material in forming the film thereon by the sputtering method.

DISCLOSURE OF INVENTION

Plastic optical devices of the present invention are plastic optical devices in which an antireflection film is coated at least on one surface of a plastic base material. The antireflection film is a multi-layered film formed by depositing a first layer on the side of the plastic base material substantially by a high-refractive material and the next layer by a low-refractive material and by alternately laminating those high-refractive materials and low-refractive materials. The antireflection film is formed so as to have a dominant wavelength range of 480 to 550 nm, an excitation purity range of 10 to 30% and luminous reflectance of 0.7 to 1.8% and so as to have a greenish interference color. Because the multi-layered antireflection film is designed and fabricated so as to have the greenish interference color in the plastic optical devices, a lens which is excellent eye-physiologically and aesthetically and is highly valuable commercially may be realized when the above-mentioned plastic optical devices is used as an spectacles plastic lens.

Further, in the plastic optical devices of the present invention, the antireflection film is formed as a multi-layered film by depositing a first layer on the side of the plastic base material substantially by the high-refractive material and the next layer by the low-refractive material and by alternately laminating those high-refractive materials and low-refractive materials; and the thickness of the low-refractive material positioned in the intermediate area of the multi-layered film is relatively thickened so that required hardness and durability as the antireflection film can be obtained. The above-mentioned antireflection film is formed by depositing the first layer by the high-refractive film and the second layer by the low-refractive film and by depositing the high-refractive films and low-refractive films alternately. The thin film of each layer forming the antireflection film is controlled adequately so that the thickness and quality of the film satisfy desirable conditions. As a result, the antireflection film having the high film performance may be realized. The desirable antireflection film may be fabricated readily in view of also film designing. The film performance such as the hardness and durability may be enhanced by increasing the thickness of the low-refractive film positioned at the intermediate area as the antireflection film applied to the plastic base material.

In the above-mentioned plastic optical devices, preferably the high-refractive material is metal oxide formed by a sputtering process by using a target made from any one of zirconium (Zr), titanium (Ti) and tantalum (Ta) or from alloys of two or more of those and the low-refractive material is metal oxide formed by a sputtering process by using a target of silicon (Si). More preferably, the target of the high-refractive material is made so as to contain Si. Thereby, the high-refractive film is formed to contain Si and the hardness and durability of the film may be improved. Preferably, in forming the high-refractive material, a target of Si is provided beside the target of the high-refractive material to form the high-refractive material as a mixed film by sputtering the two kinds of targets in the same time. The hardness and the like of the film may be improved also in this case by containing Si within the high-refractive film.

In the plastic optical devices described above, the total thickness of the antireflection film is within the range of 4800 to 5800 angstrom and the total thickness of the low-refractive materials therein is 3500 angstrom or more. When the plastic base material has curvature, the antireflection film is formed as a wide band film. Thereby, it is possible to reduce non-uniformity of interference color caused by a difference of distribution of thickness dependent on the curvature in depositing the film by the sputtering and change of the interference color caused by oblique incidence. It is preferable that the plastic base material is applied to be a base material of an spectacles plastic lens and the antireflection film having the multi-layered structure is formed on the both sides of the plastic base material. Further preferably, the antireflection film is composed of ten layers and the thickness of the low-refractive material at the sixth layer positioned at the middle is increased.

The spectacles plastic lens of the present invention is one example of the above-mentioned plastic optical devices, and the antireflection film is formed on the plastic base material by using the sputtering method, which is a multi-layered film formed by depositing a first layer on the side of the plastic base material by a high-refractive material and the next layer by a low-refractive material and by alternately laminating those high-refractive materials and low-refractive materials, and further a super-thin film of $SiO_{(2-x)}$ is formed as a pre-treatment layer on the plastic base material. Because the super-thin film as the pre-treatment layer is provided between the high-refractive film at the first layer of the antireflection film having the multi-layered structure and the plastic base material, the pre-treatment layer can prevent cracks from occurring in the antireflection film.

Preferably, the thickness of the super-thin film is within the range of 15 to 50 angstrom.

Preferably, the high-refractive material is metal oxide formed by the sputtering method by using a target made from any one of Zr, Ti and Ta or from alloys of two or more of those and the low-refractive material is metal oxide formed by the sputtering method by using a target of Si also in the spectacles plastic lens.

Preferably, the target of the high-refractive material is made so as to contain Si also in the spectacles plastic lens. Thereby, the high-refractive film is formed to contain Si and the hardness and durability of the film may be improved.

A target of Si is provided beside the target of the high-refractive material in forming the high-refractive material to form the high-refractive material as a mixed film by sputtering the two kinds of targets in the same time also in the spectacles plastic lens. The hardness of the film and the like are improved because the high-refractive film contains Si also in this case. Preferably, the antireflection film is composed of ten layers and the thickness of the low-refractive material at the sixth layer positioned at the middle is increased also in the spectacles plastic lens.

A thickness correcting mechanism for equalizing the distribution of thickness of the antireflection film is provided in a sputtering system for depositing the antireflection film on the surface of the plastic optical devices. The thickness correcting mechanism comprises a thickness correcting plate for correcting the difference of thickness of the thin film when depositing the thin film on the surface of the optical lens base material by means of the sputtering method. The thickness correcting plate is disposed at a preferable position between the target and the substrate holder and thereby, act so as to reduce or disperse the direct influence of the sputtered particles to the optical lens base material. Thereby, the difference of thickness of the thin film formed on the plurality of optical lens base materials on the substrate holder is reduced and the uniformity of the distribution of the thin film thickness is improved.

In the sputtering system in which a plurality of optical lens base materials having curvature on the surface thereof are disposed horizontally on a rotatable circular plate holder at the positions of concentric circles, and in which targets facing to the surfaces of the optical lens base materials are provided, each of the thickness correcting plates functions as a mask member for regulating the difference of film thickness, which is disposed between each of the targets and the holder in the direction from the peripheral edge to the center part of the holder. This arrangement allows, as to the large number of optical lens base materials disposed on the substrate holder at the positions of the three concentric circles for example, the film thickness difference among the optical lens base materials at the different concentric circles to be reduced, and the distribution of the film thickness to be uniform. It is noted that the thickness correcting plate which functions as the mask member is mounted at one or both of the upper and lower sides of the optical lens base material.

The targets are composed of upper and lower targets facing respectively to the both sides of the optical lens base material and the mask members are composed of the mask member for a concave surface disposed between the upper target and the substrate holder and the mask member for a convex surface disposed between the lower target and the substrate holder. In the mask member for the concave surface, the size in the circumferential direction of the sections corresponding to the positions where the optical lens base materials exist is greater than the size in the circumferential direction of the other sections, and in the mask member for the convex surface, the size in the circumferential direction of the sections corresponding to the boundaries between the optical lens base materials is greater than the size in the circumferential direction of the other sections. The mask members have also an action of interfering particles flying from non-erosion portions created in the targets.

BRIEF DESCRIPTION OF DRAWINGS

FIG. 4 is a section view showing the structure of an spectacles plastic lens having a multi-layered antireflection film;

FIGS. 5(A), 5(B) and 5(C) are section views for comparing a pre-treated spectacles plastic lens (A), an spectacles plastic lens (B) with a pre-treatment layer having a thickness out of a predetermined range, and an spectacles plastic lens (C) on which no pre-treatment has been implemented;

BEST MODE FOR CARRYING OUT THE INVENTION

Preferred embodiments of the present invention will be explained below based on the appended drawings.

An example of spectacles plastic lens will be cited as plastic optical devices and an antireflection film formed on the both sides of the spectacles plastic lens will be explained in the present embodiment. Although the spectacles plastic lens is suited most as the optical devices on which the antireflection film of the present invention is formed, the present invention is not limited only to that.

Figure 1:
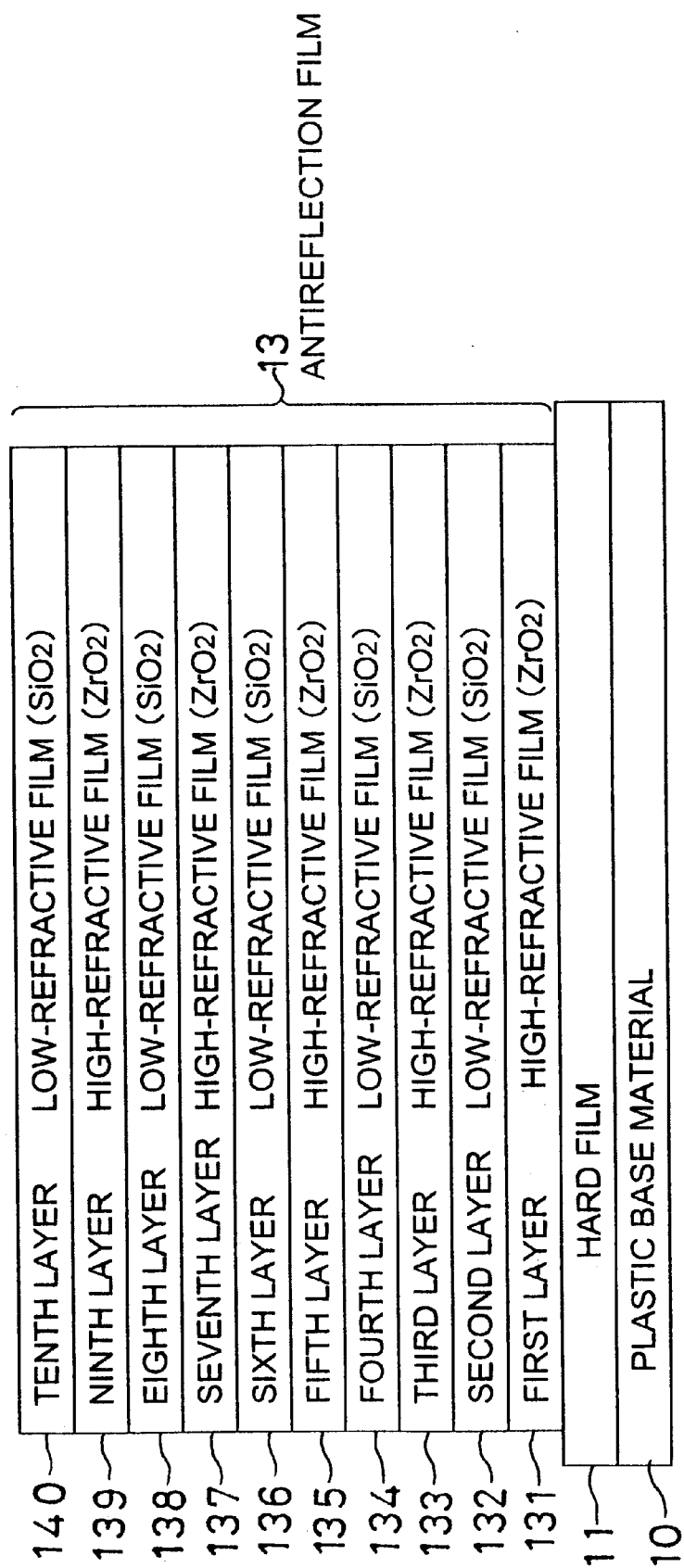
FIG. 1 is a section view showing the structure of an antireflection film according to the present invention.
Figure 2:
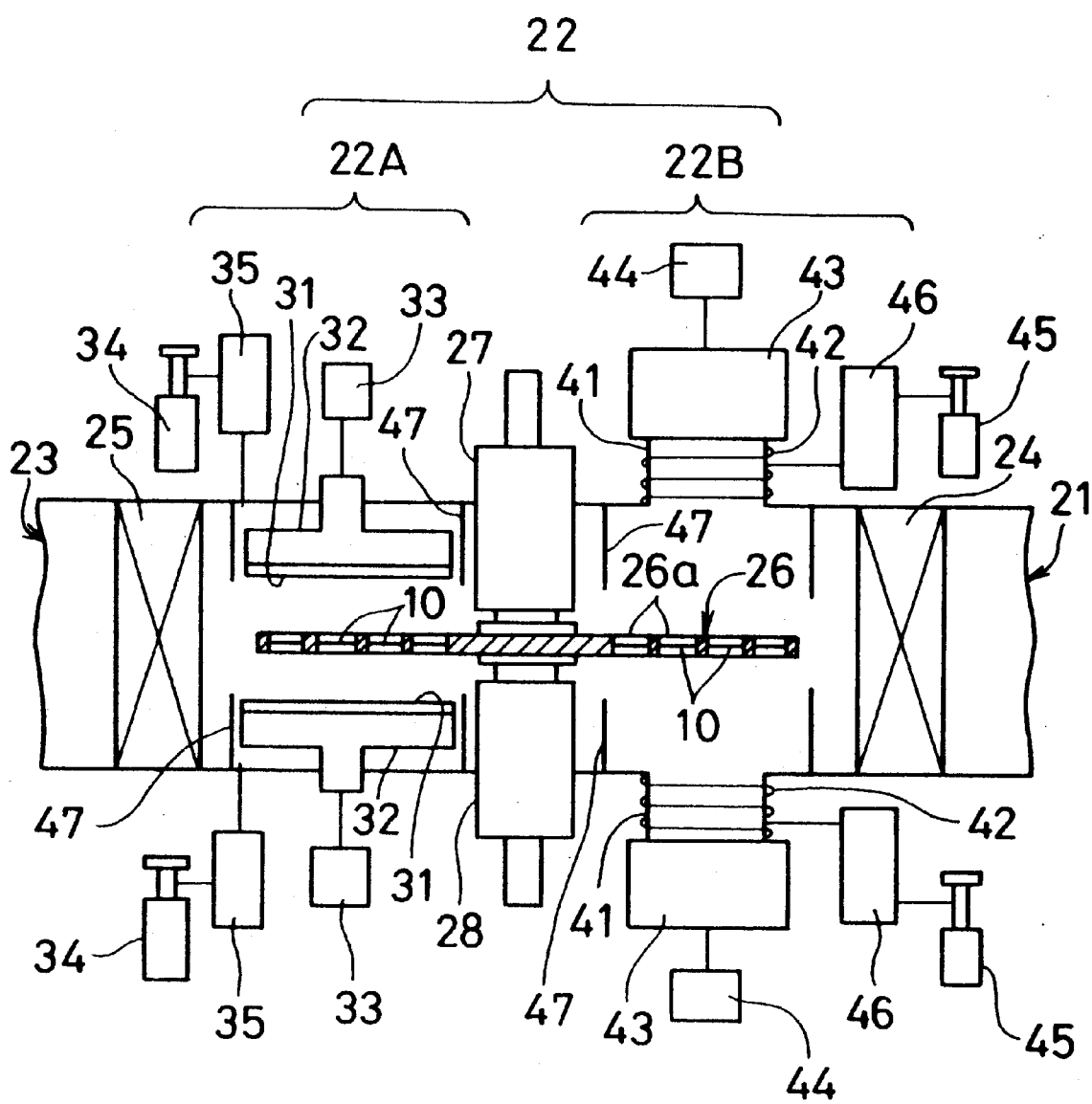
FIG. 2 is a diagram showing the structure of a sputtering film deposition system for fabricating the antireflection film.

FIG. 1 is a diagrammatic section view showing a typical example of the structure of the antireflection film and FIG. 2 is a structure diagram showing one example of a sputtering film deposition system. Although the antireflection film is formed on the both sides of the lens, FIG. 1 shows the sectional structure of the antireflection film of only one side for convenience of the explanation. The antireflection film having the similar structure is formed also on the other side of the lens.

A plastic base material 10 shown in FIG. 1 is a base material of the spectacles plastic lens. CR-39 (diethylene glycol bisallyl carbonate polymer nd=1.499) is used for example as the material of the plastic base material 10. A hard film 11 is coated on the surface of the plastic base material 10 in order to enhance the hardness thereof. Organic silicon resin containing colloidal silica for example is used for the hard film 11. The detail of the composition thereof is described in Japanese Patent Publication No. Hei. 4-55615 for example.

It is noted that normally the plastic base material of the spectacles plastic lens has curvature and has a curved shape. However, FIG. 1 shows it in the form of a flat plate for convenience of explanation. When the plastic base material is curved, the film deposited thereon is curved along the surface of the base material in general.

The antireflection film 13 to be coated on the plastic base material 10 is formed on the hard film 11 because the hard film 11 is coated thereon in the present embodiment. As shown in FIG. 1, the antireflection film 13 of the present embodiment is formed as a multi-layered film of ten layers for example. Within the antireflection film 13, a film 131 at the lowermost layer positioned on the side of the plastic base material 10 is a high-refractive film. What is formed next on the high-refractive film 131 is a low-refractive film 132. Thereafter, films 133 through 140 are formed in serial order while repeating the order of the high-refractive film and the low-refractive film alternately. As a result, the films 131, 133, 135, 137 and 139 of the first, third, fifth, seventh and ninth layers are laminated as the high-refractive films and the films 132, 134, 136, 138 and 140 of the second, fourth, sixth, eighth and tenth layers are laminated as the low-refractive films, thus forming the antireflection film 13 having the multi-layered structure. The outside of the low-refractive film 140 of the tenth layer is atmosphere.

In case of the present embodiment, the high-refractive material constituting the above-mentioned high-refractive film is metal oxide $ZrO_2$ of zirconium (Zr) for example and the low-refractive material constituting the above-mentioned low-refractive film is metal oxide $SiO_2$ of silicon (Si) for example. Beside zirconium, metal oxides ($TiO_2$, $Ta_2O_5$ and the like) of titanium (Ti) and tantalum (Ta) may be used. Further, metal oxide made from two or more alloys among zirconium (Zr), titanium (Ti) and tantalum (Ta) may be used as the high-refractive material. The high- and low-refractive films are fabricated by utilizing the sputtering method as described later. Therefore, targets of the high- and low-refractive materials are prepared.

The high-refractive film may be also formed as a mixed film containing the above-mentioned high-refractive material and Si. The performance of the film such as the hardness and durability may be improved by containing Si within the high-refractive film. Such mixed film may be fabricated by using the following two methods for example. The first method is to include Si within the target of the high-refractive material. The high-refractive film containing Si may be deposited by the sputtering process using such target. The second method is to provide a target of Si beside the target of the high-refractive material. The mixed film may be formed by sputtering the target of the high-refractive material and that of the Si in the same time. The target of Si may be used also as target of the low-refractive material.

In the antireflection film 13 having the multi-layered structure formed as described above, preferably the thickness of the high-refractive and low-refractive films of the respective layers is set as follows, where $\lambda$ is 500 nm (nanometer).

The thickness of the high-refractive film of the first layer is set so as to be included within the range from 0.075 $\lambda$ to 0.085 $\lambda$, the thickness of the low-refractive film of the second layer to be included within the range from 0.115 $\lambda$ to 0.130 $\lambda$, the thickness of the high-refractive film of the third layer to be included within the range from 0.177 $\lambda$ to 0.199 $\lambda$, the thickness of the low-refractive film of the fourth layer to be included within the range from 0.101 $\lambda$ to 0.114 $\lambda$, the thickness of the high-refractive film of the fifth layer to be included within the range from 0.102 $\lambda$ to 0.115 $\lambda$, the thickness of the low-refractive film of the sixth layer to be included within the range from 0.471 $\lambda$ to 0.511 $\lambda$, the thickness of the high-refractive film of the seventh layer to be included within the range from 0.102 $\lambda$ to 0.115 $\lambda$, the thickness of the low-refractive film of the eighth layer to be included within the range from 0.045 $\lambda$ to 0.060 $\lambda$, the thickness of the high-refractive film of the ninth layer to be included within the range from 0.270 $\lambda$ to 0.304 $\lambda$, and the thickness of the low-refractive film of the tenth layer to be included within the range from 0.244 $\lambda$ to 0.275 $\lambda$. Within those values, the most preferable value of the thickness of each layer is the center value in each range.

The total thickness of the above-mentioned antireflection film 13 is preferred to be included within the range of 4800 to 5800 angstrom and the total thickness of the low-refractive films therein is preferred to be 3500 angstrom or more in order to assure the durability such as the hardness and abrasion resistance required as the antireflection film, the adhesion as a film and others. In case of the present embodiment, the thickness of the low-refractive film 136 of the sixth layer positioned at the intermediate area is thickened as compared to other films to achieve the required thickness of the antireflection film 13 to satisfy the requirements such as the hardness and durability. The film positioned at the middle among the plurality of low-refractive films is thickened based on the reason that such structure is appropriate in view of stress and others of the film.

It is noted that a number of layers in the antireflection film 13 is not limited to ten as described above. While the number of layers in the antireflection film having the multi-layered structure is preferred to be less from the aspect of production of the film, it is set arbitrarily in connection with the required film performance.

The plastic base material of the normal spectacles plastic lens has curvature and a curved shape as described before. When the antireflection film 13 having the multi-layered structure shown in FIG. 1 is to be fabricated on the curved plastic base material by using the sputtering method as described later, a difference of distribution of thickness is produced depending on the curvature of each part of the plastic base material, thus causing non-uniformity of the interference color and change in the interference color due to oblique incidence. Then, in order to reduce such troubles, it is preferred to design the antireflection film 13 as a film having a wide band characteristic.

Next, one example of a system for fabricating the antireflection film 13 described above by utilizing the sputtering method and a fabrication process will be explained in outline with reference to FIG. 2. FIG. 2 shows a longitudinal section view of the main part of the sputtering film deposition system. This sputtering film deposition system is capable of depositing the antireflection films 13 having the multi-layered structure on the both sides of the plastic base material 10 in the same time.

The sputtering film deposition system may be roughly divided into an introducing chamber 21 for carrying in an object to be processed, a vacuum processing chamber (sputtering film deposition chamber) 22 for depositing the high-refractive films and low-refractive films alternately on the both sides of the plastic base material 10 and a preliminary processing chamber 23. The introducing chamber 21, the vacuum processing chamber 22 and the preliminary processing chamber 23 are parted by gate valves 24 and 25. The gate valves 24 and 25 are opened/closed at appropriate timing in carrying in/out the object.

A substrate holder 26 carried into the inside of the sputtering film deposition system via the introducing chamber 21 is set within the vacuum processing chamber 22 via the gate valve 24. It is noted that a carriage mechanism for transporting the substrate holder 26 is not shown in FIG. 2. The substrate holder 26 has a shape of a disc for example. A large number of base material holding holes 26a are formed in the substrate holder 26. The plastic base materials 10 used for the spectacles plastic lenses are disposed in those holes 26a. Because the base material holding holes 26a are opened to the upper and lower sides, the plastic base materials 10 held by the base material holding holes 26a face to the spaces above and under the substrate holder 26. As a result, the above-mentioned antireflection films 13 may be formed on the both sides of the plastic base material 10 by the sputtering method.

The sputtering film deposition process in the vacuum processing chamber 22 comprises a sputtering step for depositing a metallic thin film and a transforming step for transforming the metallic thin film deposited in the sputtering step into an oxide thin film. Therefore, the vacuum processing chamber 22 is provided with a sputtering step area 22A and a transforming step area 22B in constructing the system.

The substrate holder 26 is disposed horizontally by supporting the center thereof with upper and lower supporting members 27 and 28 within the vacuum processing chamber 22. The upper and lower supporting members 27 and 28 are driven vertically by a hydraulic cylinder or the like not shown and can be freely rotated by a motor rotating mechanism built therein. The substrate holder 26 is rotated at predetermined speed by the rotating operation of the upper and lower supporting members 27 and 28 in depositing the antireflection film 13 on the plastic base material 10. Accordingly, while the large number of plastic base materials 10 disposed on the substrate holder 26 pass through the sputtering step area 22A and the transforming step area 22B, the plastic base materials 10 are processed by the sputtering in the sputtering step area 22A and by the transforming in the transforming step area 22B.

Sputtering units are disposed above and below the substrate holder 26 in the sputtering step area 22A. Each sputtering unit comprises a target 31, a sputter electrode 32, a sputter power supply 33, a sputter gas bottle 34, and a mass flow (controller) 35. When the substrate holder 26 rotates and the plastic base material 11 comes between the upper and lower targets 31, the target substance emitted from the target 31 in the sputtering condition deposits on the both sides of the plastic base material 11, thus forming thin films of the target substance on the both surfaces of the plastic base material 11. At this time, sputtering gas such as argon gas is introduced from the sputter gas bottle 34 via the mass flow 35 so as to regulate the sputtering atmosphere.

In order to fabricate the aforementioned antireflection film 13 in the sputtering film deposition process in the vacuum processing chamber 22, the metal oxide $ZrO_2$ is deposited as the high-refractive film of the first layer and the metal oxide $SiO_2$ is deposited as the low-refractive film of the second layer based on the above-mentioned sputtering step and the transforming step described later. Thereafter, the high-refractive films $ZrO_2$ and the low-refractive films $SiO_2$ are formed alternately up to the tenth layer. In the sputtering step area 22A, metal which is the source of each metal oxide is deposited. In the first sputtering step for depositing the high-refractive film 131 of the first layer, the target made from zirconium Zr is prepared and Zr films are formed on the both sides of the plastic base material 10. In the sputtering step for depositing the low-refractive film 132 of the second layer, the target is exchanged to the other target made from silicon Si and Si films are formed on the both sides of the plastic base material 10 after the sputtering. The antireflection film 13 may be thus formed by laminating the high-refractive films and low-refractive films alternately by exchanging the target to the high-refractive material or to the low-refractive material. It is noted that a mechanism for exchanging the targets is not shown in FIG. 2.

In the transforming step area 22B, induction coupled plasma generating units are disposed above and below the substrate holder 26. The induction coupled plasma generating unit comprises a high-frequency discharging chamber 41, a high-frequency coil 42, a matching box 43, a high-frequency power supply 44, a reactive gas bottle 45 and a mass flow 46. When the substrate holder 26 rotates and the plastic base material 11 to be processed comes between the upper and lower induction coupled plasma generating units, the plastic base material 10 is exposed to plasma of oxygen introduced from the reactive gas bottle 45 via the mass flow 46 to oxidize the metal (Zr or Si) deposited in the sputtering step to transform into oxide ($ZrO_2$ or $SiO_2$).

As described above, the antireflection films 13 having the multi-layered structure composed of the $ZrO_2$ (high-refractive film) and $SiO_2$ (low-refractive film) films shown in FIG. 1 are formed on the both sides of the plastic base material 10 by repeating the sputtering step and the transforming step while exchanging the targets on the both sides of the large number of plastic base materials 10 on the substrate holder 26 set to be freely rotatable within the vacuum processing chamber 22.

It is noted that a shielding member 47 for separating the sputtering step area 22A from the transforming step area 22B is provided within the vacuum processing chamber 22.

The following is one example as to conditions for forming the $ZrO_2$ film, i.e., the high-refractive film, in the sputtering step in the sputtering film deposition system:

(1) Sputtering Gas: Argon gas (Ar) is used and is supplied with a flow rate within the range of 380 to 580 cc./min.;

(2) Oxidizing Gas: Oxygen gas ($O_2$) is supplied with a flow rate within the range of 46 to 60 cc./min;

(3) Degree of Vacuum during Film Deposition: $8.7 \times 10^{-3}$ Torr;

(4) Sputtering Output: DC power is supplied within the range of 3.3 to 3.7 kW;

(5) Oxidization Gun Output: 0.4 kW of high-frequency (RF) electric power is supplied; and (6) Deposition Rate: 320 to 360 angstrom/min.

The following is one example as to conditions for forming the $SiO_2$ film, i.e., the low-refractive film, in the sputtering step in the sputtering film deposition system:

(1) Sputtering Gas: Argon gas (Ar) is used and is supplied with a flow rate within the range of 110 to 190 cc./min;

(2) Oxidizing Gas: Oxygen gas ($O_2$) iS supplied with a flow rate within the range of 64 to 70 cc./min;

(3) Degree of Vacuum during Film Deposition: $2.4 \times 10^{-3}$ Torr;

(4) Sputtering Output: DC power is supplied within the range of 5.1 to 5.3 kW;

(5) Oxidization Gun Output: 0.4 kW of high-frequency (RF) electric power is supplied; and (6) Deposition Rate: 340 to 380 angstrom/min.

The following is the performance of the antireflection film 13 thus obtained on the spectacles plastic lens having such antireflection film in the initial period after its formation and the performance thereof after one month in constant temperature and humidity.

As the performance of the film, its abrasion resistance, adhesion, alkali resistance, heat resistance, acid resistance, artificial perspiration resistance and interference color were measured and evaluated by the following methods:

(1) Abrasion Resistance: A steel wool test was conducted. Under the test, the antireflection film was scrubbed by the steel wool #0000 and the degree of scratch was judged visually;

(2) Adhesion: The surface of the plastic lens having the antireflection film was crosscut into 100 divisions at intervals of 1 mm and a cellophane tape was pasted strongly thereon. Then, it was peeled off rapidly to check whether or not the multi-layered antireflection film was peeled off;

(3) Alkali Resistance: The plastic lens having the antireflection film was soaked into an aqueous solution of 10 wt. % of NaOH for one hour to observe the state of erosion of the surface of the multi-layered antireflection film;

(4) Heat Resistance: The plastic lens having the antireflection film was heated by putting into an oven for one hour to check whether or not it causes cracks. The heating temperature was increased by 5° C. each from 70° C. to discriminate the superiority by the temperature at which it causes cracks;

(5) Acid Resistance: The plastic lens having the antireflection film was soaked into aqueous solutions of 10 wt. % of HCl and of 10 wt. % of $H_2SO_4$ for one hour to observe the state of erosion of the surface of the multi-layered antireflection film;

(6) Artificial Perspiration Resistance: The plastic lens having the antireflection film was soaked into perspiration artificially made at 20° C. for 24 hours and containing NaCl, $Na_2S$, $NH_4$ and lactic acid to observe the state of erosion of the surface of the multi-layered antireflection film; and (7) Interference Color: Reflected light of a fluorescent lamp was observed visually.

The following is the performance of the antireflection film 13 in the initial period after its formation based on the foregoing measurement and evaluation:

(1) As for the abrasion resistance, there was no problem as almost no scratch was made;

(2) As for the adhesion, all of the 100 divisions did not peel;

(3) As for the alkali resistance, there was no problem as almost no damage was given;

(4) As for the heat resistance, cracks occurred at 75° C.;

(5) As for the acid resistance, there was no problem as no change was seen;

(6) As for the artificial perspiration resistance, there was no problem as no change was seen; and (7) The interference color was green.

The following is the performance of the antireflection film 13 after one month in the environment of constant temperature and humidity based on the foregoing measurement and evaluation, (1) As for the abrasion resistance, there was no problem as almost no scratch was made;

(2) As for the adhesion, all of the 100 divisions did not peel;

(3) As for the alkali resistance, there was no problem as almost no damage was given;

(4) As for the heat resistance, cracks occurred at 60° C.;

(5) As for the acid resistance, there was no problem as no change was seen;

(6) As for the artificial perspiration resistance, there was no problem as no change was seen; and (7) As for the interference color, there was no problem as no change was seen in the greenish interference color.

Figure 3:
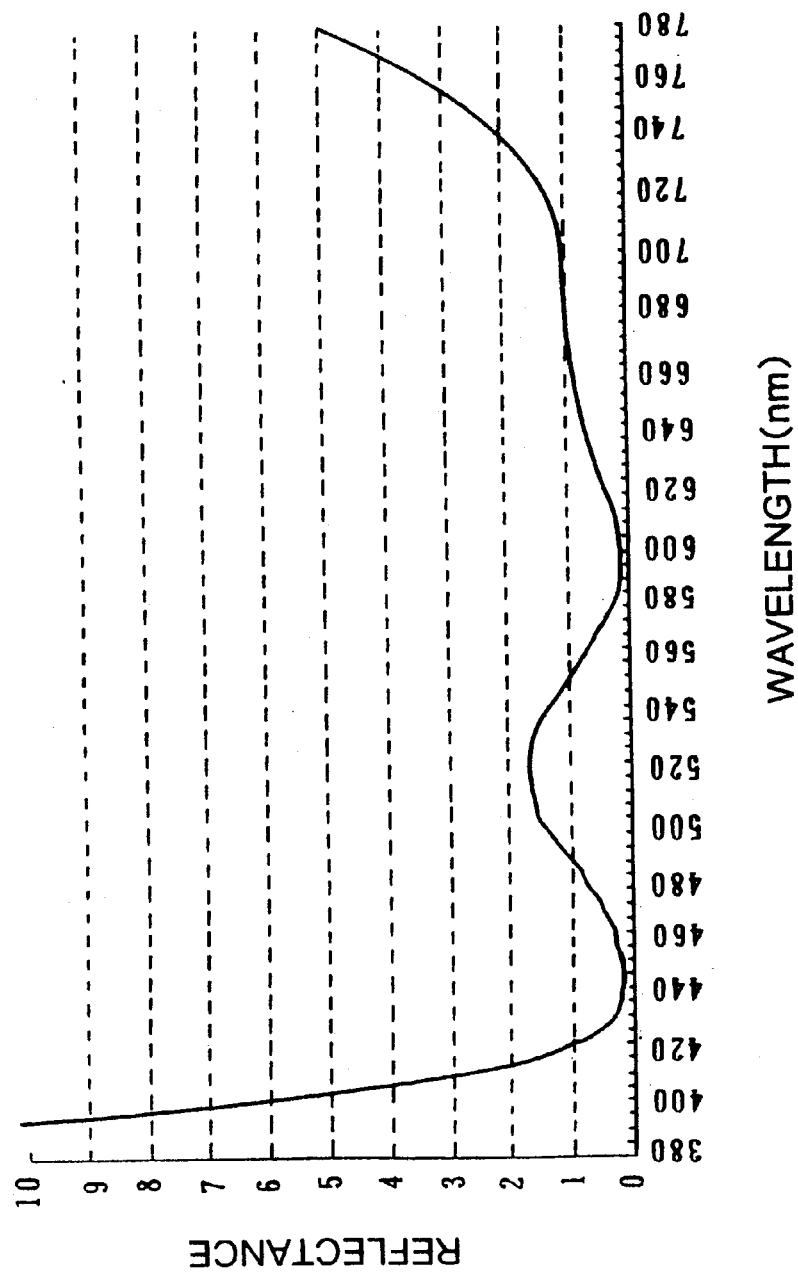
FIG. 3 is a graph showing a spectral reflectance curve of the antireflection film.

FIG. 3 shows a measured example of a spectral reflectance curve of the antireflection film 13. As it is apparent from this spectral reflectance curve, the low reflectance has been achieved in a wide wavelength range of about 420 to 740 nm, i.e., the wide band antireflection film has been realized. The reflectance is relatively high in the wavelength range of about 480 to 550 nm in particular.

Further, the above-mentioned antireflection film has the greenish interference color by setting its dominant wavelength range as 480 to 550 nm, excitation purity range as 10 to 30% and luminous reflectance as 0.7 to 1.8%. While luminous reflectance and chromaticity are used in general in indicating a color of a reflecting object (the interference color of the antireflection film on the surface of the lens in case of the present embodiment), dominant wavelength and excitation purity are used in monochromatically indicating the chromaticity. Here, the luminous reflectance is expressed by the ratio of luminous flux reflected from an object to luminous flux incident on the object, corresponds to the Y-value of the tristimulus values and is given by the following expression:

$$R = \int_{380}^{780} P_\lambda R_\lambda V_\lambda \, d\lambda \bigg/ \int_{380}^{780} P_\lambda V_\lambda \, d\lambda$$

where, R is the luminous reflectance, $P_\lambda$ is spectral composition of incident light, $V_\lambda$ is relative luminous efficiency and $R_\lambda$ is spectral reflectance.

It becomes the criterion for judging how bright the light having the spectral composition $P_\lambda$ looks when it enters a lens.

The dominant wavelength and the excitation purity are both elements for indicating the chromaticity by monochromatic representation. The wavelength corresponding to a point where a line connecting a point represented by chromaticity coordinates on a chromaticity diagram and a light source intersects with a spectrum locus is called the dominant wavelength specifically.

The antireflection film of the present embodiment having the spectral reflectance curve shown in FIG. 3 has had 508 nm of dominant wavelength, 22% of excitation purity, 0.963% of luminous reflectance and the greenish interference color.

Although the method for forming the antireflection film by using the sputtering method has been explained above, the similar antireflection film having the multi-layered structure may be fabricated by other methods such as a vacuum evaporation method and a CVD method.

Further, although the antireflection films having the multi-layered structure have been formed on the both sides of the base material of the spectacles plastic lens in the present embodiment, the antireflection film may be formed only one side in case of other plastic optical devices.

Still more, although the first layer of the antireflection film 13 has been the high-refractive film 131 in the present embodiment, it needs not be the first layer strictly. For instance, another film may be present between the hard film 12 and the high-refractive film 131. Accordingly, it will do if the high-refractive film 131 is substantially the first layer in the antireflection film 13. This point will be detailed further in a second embodiment.

According to the plastic optical devices described above, the antireflection film having the multi-layered structure is formed by depositing the high-refractive material as the first layer and the low-refractive material as the second layer and by laminating the high-refractive materials and low-refractive materials alternately on the both sides of the plastic base material for example by using the sputtering method and the thickness of the low-refractive material at the middle of the antireflection film is thickened relatively, so that the antireflection film having the highly evaluated film performance may be realized. Further, because the antireflection film is formed as the wide band film, it can reduce the non-uniformity of interference color which is caused by the difference of distribution of thickness dependent on the curvature in the deposition by the sputtering method and the change in the interference color caused by oblique incidence, when the plastic base material has the curvature. Still more, it allows the greenish interference color to be obtained stably and the antireflection film which is excellent eye-physiologically and aesthetically and highly valuable commercially to be fabricated.

Next, the second embodiment will be explained with reference to FIGS. 4 and 5. In this present embodiment, the plastic optical devices is limited to be the spectacles plastic lens. The film structure formed on the surface of the plastic base material 10 is improved in order to prevent the occurrence of cracks. The elements in FIGS. 4 and 5 substantially identical with those elements explained in FIG. 1 will be denoted by the same reference numerals and the repeated detailed explanation thereof will be omitted here.

In FIG. 4, the reference numeral (10) denotes a plastic base material, (11) a hard film, and (13) an antireflection film. The plastic base material 10, the hard film 11 and the antireflection film 13 are the same ones with those explained in the foregoing embodiment. The antireflection film 13 is actually formed on the hard film 11. More specifically, a super-thin film 12 of $SiO_{(2-x)}$ (x=0, 1) is formed as a pre-treatment layer between the hard film 11 and the anti-reflection film 13. That is, the $SiO_{(2-x)}$ super-thin film 12 is formed as the pre-treatment layer when forming the antireflection film 13 having the multi-layered structure on the plastic base material 10. The thickness of the super-thin film 12 is preferred to be included within the range from 15 to 50 angstrom. Stress balance between the interface of the plastic base material 10 and the high-refractive film 131 changes appropriately by providing the super-thin film 12 as the pre-treatment layer. As a result, it becomes possible to prevent cracks from occurring on the antireflection film 13 caused by humidity and pressure and to keep the appearance as the spectacles plastic lens well. Further, the adhesion between the antireflection film 13 and the plastic base material 10 may be kept high naturally. It is noted that there arises a problem that the adhesion drops when the thickness of the super-thin film 12 exceeds 50 angstrom.

Next, the antireflection film (A) having the above-mentioned structure will be compared with two antireflection films (B) and (C) having other structures with reference to FIG. 5. The antireflection film 13 having the multi-layered structure in FIG. 5(A) comprises ten layers of high-refractive films and low-refractive films. Numerals 1 through 10 at the left edge of the figure of the antireflection film 13 indicate the layer Nos. The thickness of the respective layers from the high-refractive film of the first layer to the low-refractive film of the tenth layer are 0.08 λ, 0.12 λ, 0.19 λ, 0.11 λ, 0.11 λ, 0.49 λ, 0.11 λ, 0.05 λ, 0.29 λ and 0.26 λ as described in the figure. These thicknesses are included within the aforementioned ranges of thickness of the respective layers. The above-mentioned structure of the antireflection film 13 is the same also in the antireflection films in FIGS. 5(B) and (C).

In the arrangement in FIG. 5(A), the antireflection film 13 is formed on the plastic base material 10 on whose surface the hard film 11 is coated via the $SiO_{(2-x)}$ super-thin film 12 having the thickness of 15 angstrom. That is, the $SiO_{(2-x)}$ super-thin film 12 is formed as the pre-treatment film. It is noted that the upper side of the low-refractive film of the tenth layer is atmosphere.

In the arrangement in FIG. 5(B), an $SiO_{(2-x)}$ super-thin film 12a is formed in the same manner as the pre-treatment film between the antireflection film 13 and the plastic base material 10 on whose surface the hard film 11 is coated. However, the thickness of the super-thin film 12a is 80 angstrom, which is greater than 50 angstrom and is not included within the aforementioned range.

In the arrangement in FIG. 5(C), no $SiO_{(2-x)}$ super-thin film is formed between the antireflection film 13 and the plastic base material 10 on whose surface the hard film 11 is coated. That is, no pre-treatment by means of the above-mentioned super-thin film is implemented. The antireflection film 13 is formed directly on the plastic base material 10 on which the hard film 11 is coated.

Next, the comparison result of the film performance of the respective spectacles plastic lenses having the structures shown in FIGS. 5(A), 5(B) and 5(C) will be explained. In this comparison, the spectacles plastic lenses having the respective structures shown in FIGS. 5(A), 5(B) and 5(C) were fabricated, were fitted into spectacles frames and were left for 24 hours within a constant temperature and humidity furnace at 90% of humidity and 40° C. of temperature. Then, the adhesion of the antireflection film and the appearance (whether or not cracks have occurred) of the spectacles plastic lenses were checked. It is noted that the "adhesion" was evaluated by crosscutting the surface of the spectacles plastic lens with the antireflection film into 100 divisions at intervals of 1 mm, pasting cellophane tape strongly, and then peeling it off rapidly to check whether or not the antireflection film is peeled off.

As a result, the adhesion was 100/100, no peeling was seen and the appearance did not change in the spectacles plastic lens having the structure shown in FIG. 5(A). In the spectacles plastic lens having the structure shown in FIG. 5(B), the adhesion was 0/100, all of the antireflection films were peeled and the performance was extremely bad. However, the appearance did not change. In the spectacles plastic lens having the structure shown in FIG. 5(C), although the adhesion was 100/100 and was good, it caused a problem as for the appearance that cracks occur from the edge portion of the lens.

As it is apparent from the above comparison, the antireflection film 13 having the super-thin film 12 coated as the pre-treatment film on the spectacles plastic lens (the plastic base material 10) had the high performance in terms of the adhesion and appearance. In addition to that, the antireflection film 13 exhibits the excellent performance also in terms of the abrasion resistance, alkali resistance, heat resistance, acid resistance and artificial perspiration resistance. This antireflection film also achieves the low reflectance in a wide wavelength range of about 420 to 740 nm in the spectral reflectance curve, thus realizing the wide band antireflection film. The reflectance is relatively high in the wavelength range of about 480 to 550 nm in particular. Further, the above-mentioned super-thin film and the antireflection film present the greenish interference color by setting the dominant wavelength to be 480 to 550 nm, the excitation purity to be 10 to 30% and the luminous reflectance to be 0.7 to 1.8%.

According to the spectacles plastic lens described above, because the $SiO_{(2-x)}$ super-thin film 12 is formed as the pre-treatment layer when forming the multi-layered antireflection film whose first layer is the high-refractive film, it is possible to prevent cracks from occurring and to improve the appearance as the spectacles plastic lens. It is also possible to obtain the greenish interference color stably by the super-thin film and others and to fabricate the spectacles plastic lens which is excellent eye-physiologically and aesthetically and highly valuable commercially.

Next, a third embodiment will be explained with reference to FIGS. 6 through 10. In the present embodiment, a mechanism for enhancing the uniformity of the thickness of the thin films formed on the both sides of the plastic base material 10 is added in the arrangement of the second sputtering film deposition system described above. The elements in FIG. 6 substantially the same with those elements explained in FIG. 2 will be denoted by the same reference numerals and their detailed repeated explanation will be omitted here. It is noted that the material of the base material 10 is not limited to plastic and may be glass for example.

The plastic base material 10 is the base material of the spectacles plastic lens having a meniscus shape. The anti-reflection film is deposited on the both sides of the plastic base material 10 as the spectacles plastic lens. The antireflection film is the multi-layered film in which the high-refractive films (e.g., $ZrO_2$) and the low-refractive films (e.g., $SiO_2$) are laminated alternately as described before. Because the plastic base material 10 is an spectacles plastic lens, the both sides thereof have curvature. In concrete, one surface of the plastic base material 10 is a concave surface and the other surface is a convex surface. The plastic base material 10 is set horizontally in the substrate holder 26. In this state, normally the plastic base material 10 is set while facing the concave surface up and the convex surface down.

Figure 6:
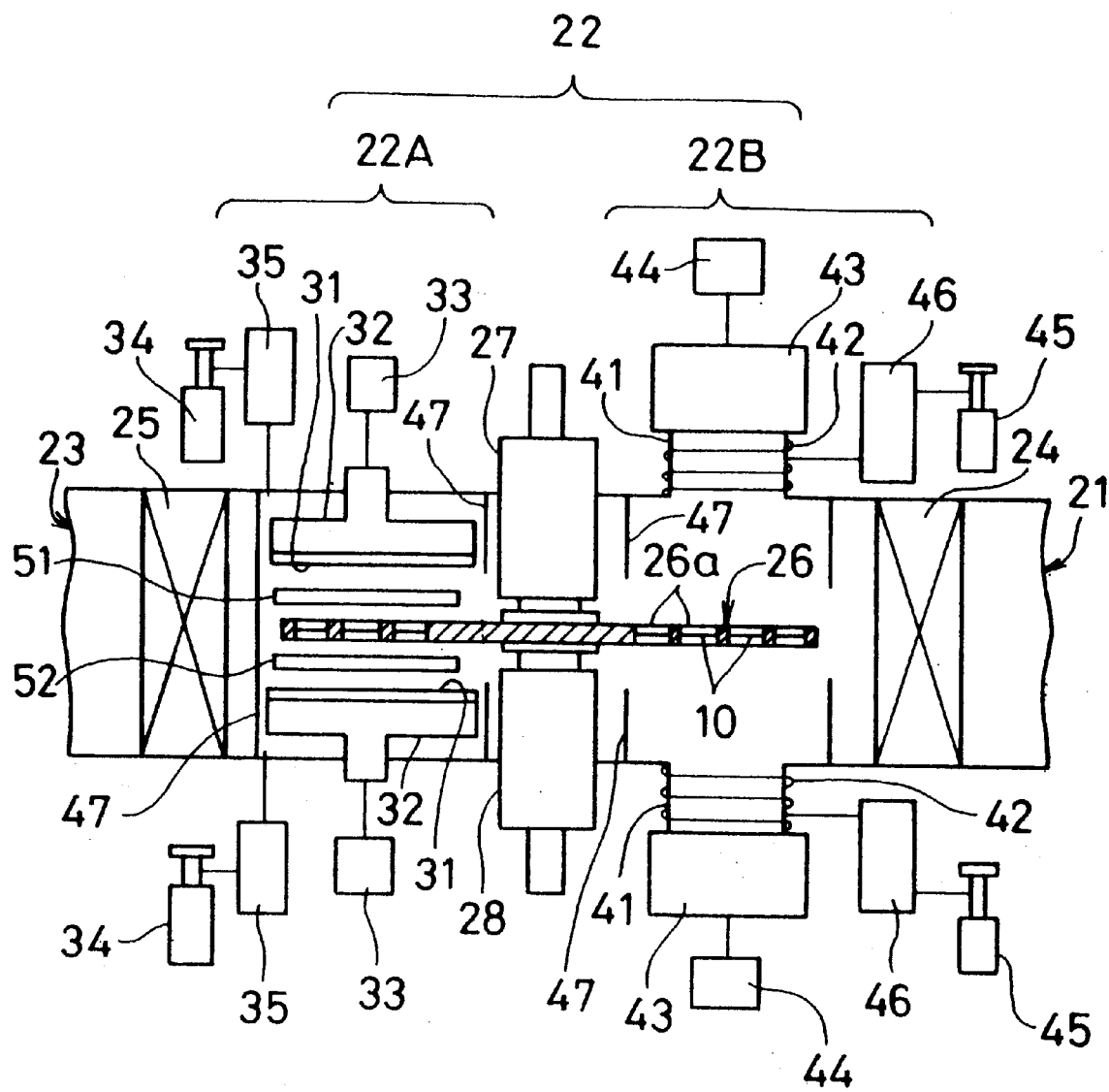
FIG. 6 is a diagram showing the structure of the main part of a sputtering film deposition system to which a thickness correcting mechanism is attached.

The structure and operation of the sputtering film deposition system are the same as described before. The structure specific to the sputtering film deposition system shown in FIG. 6 is that a thickness correcting mechanism is provided within the sputtering step area 22A of the vacuum processing chamber 22.

The thickness correcting mechanism comprises thickness correcting plates 51 and 52 disposed between the respective targets 31 and the substrate holder 26 in the sputtering step area 22A. It is noted that in FIG. 6, structures for supporting the thickness correcting plates 51 and 52 are not shown. An arbitrary structure may be adopted for the supporting structure by utilizing the empty space. Functionally, the thickness correcting plates 51 and 52 are mask members for covering the plastic base material 10 which has come to the position facing to the center part of the target 31 by the rotating operation of the substrate holder 26 by a desirable shape (covering pattern). Sputtering particles from the target 31 may be shielded partly, the thickness of the thin film deposited on the surface of the respective plastic base materials 10 may be corrected and the thickness of the film on the surface may be equalized by covering the several plastic base materials 10 by the thickness correcting plates which function as the mask members having the desirable covering pattern.

Figure 7:
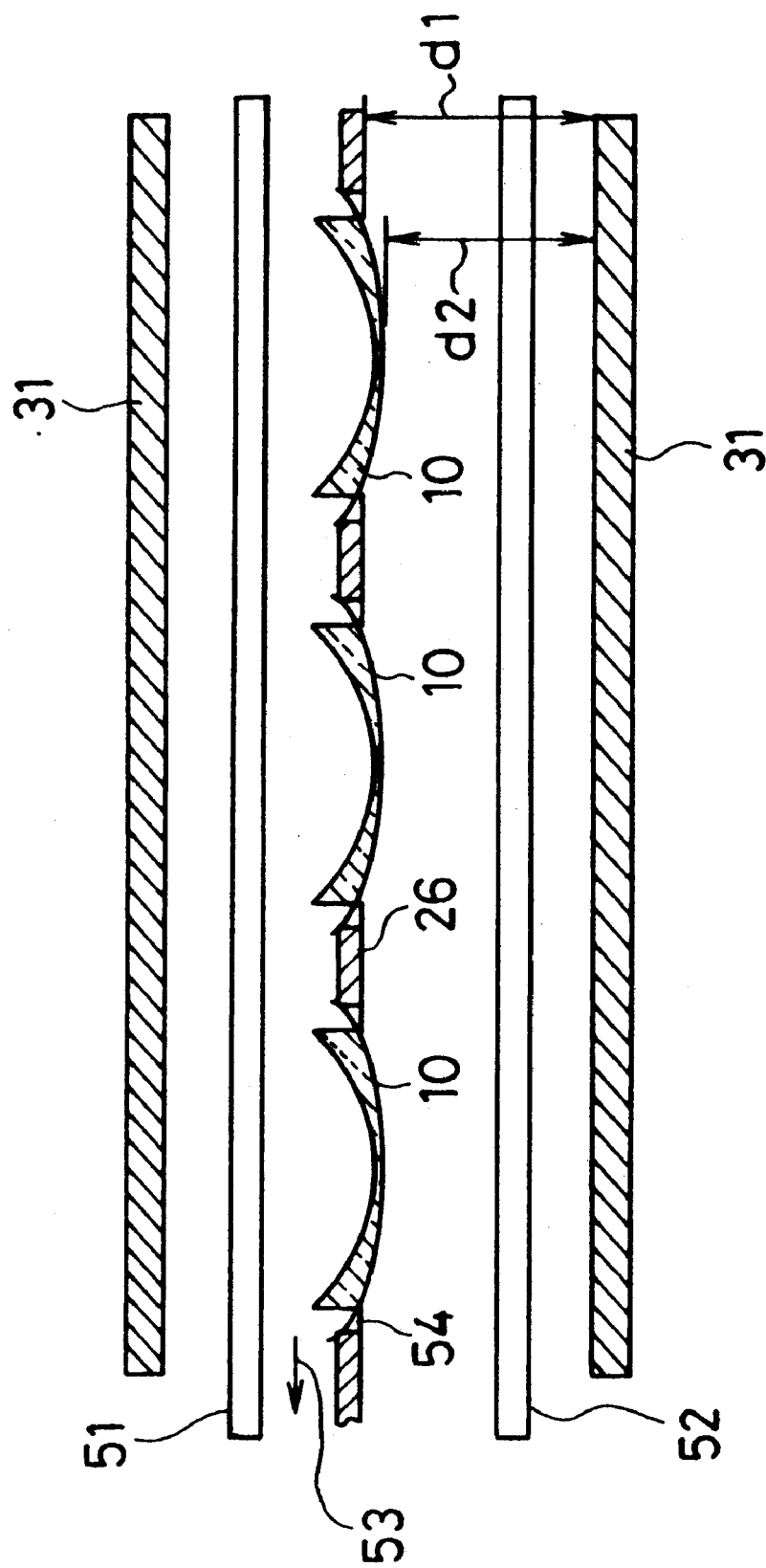
FIG. 7 is a longitudinal section view showing the state of disposition of plastic base materials in a substrate holder and the positional relationship among the substrate holder, targets and thickness correcting plates.

The thickness correcting plate will be explained in detail below with reference to FIGS. 7 through 9. FIG. 7 is an enlarged view showing the disposition of the plastic base materials 10 set on the substrate holder 26 and the relationship between the upper and lower targets 31 and the thickness correcting plates 51 and 52 more concretely, FIG. 8 shows one example of the planar shape of the thickness correcting plate 51 and FIG. 9 shows one example of the planar shape of the thickness correcting plate 52.

In FIG. 7, the direction indicated by an arrow 53 is the direction toward the center of rotation of the substrate holder 26, d1 is a distance between the substrate holder 26 and the lower target 31 and d2 is a distance between the plastic base material 10 and the lower target 31. As it is apparent from the figure, the plastic base materials 10 are disposed on the base material holding holes 26a created through the substrate holder 26 via fittings 54 while facing the concave surface up and facing the convex surface down. The disposition of the plastic base material 10 is set so that the lowermost point of the convex surface of the plastic base material 10 comes to the position almost at the middle between the upper and lower targets 31, and thereby, the position of the substrate holder 26 is determined. Accordingly, the above-mentioned distance d2 is set between the lower target 31 and the lowermost point of the lower face of the plastic base material 10. Further, the distance dl between the substrate holder 26 and the lower target 31 is slightly greater than the distance between the substrate holder 26 and the upper target 31.

Figure 8:
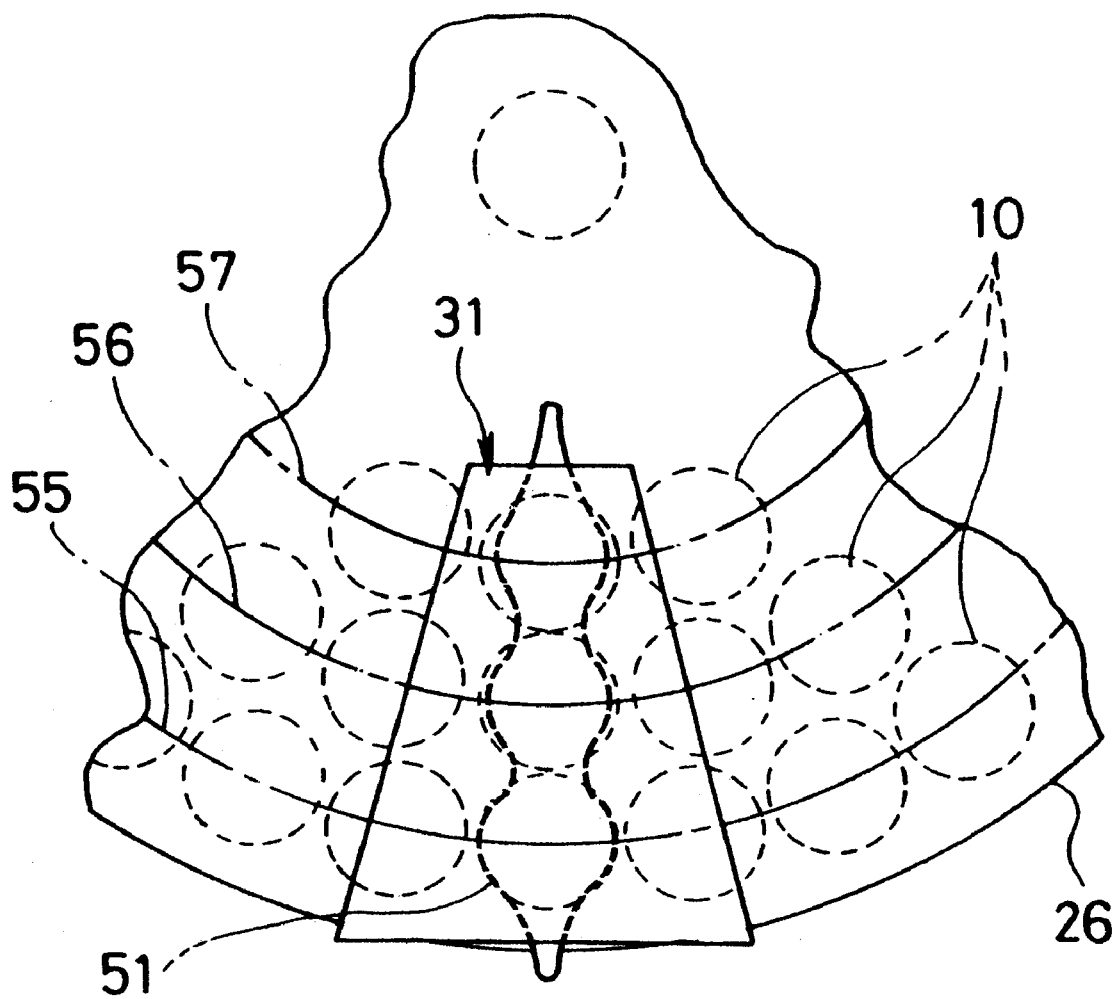
FIG. 8 is a plan view showing a planar shape of the upper thickness correcting plate.
Figure 9:
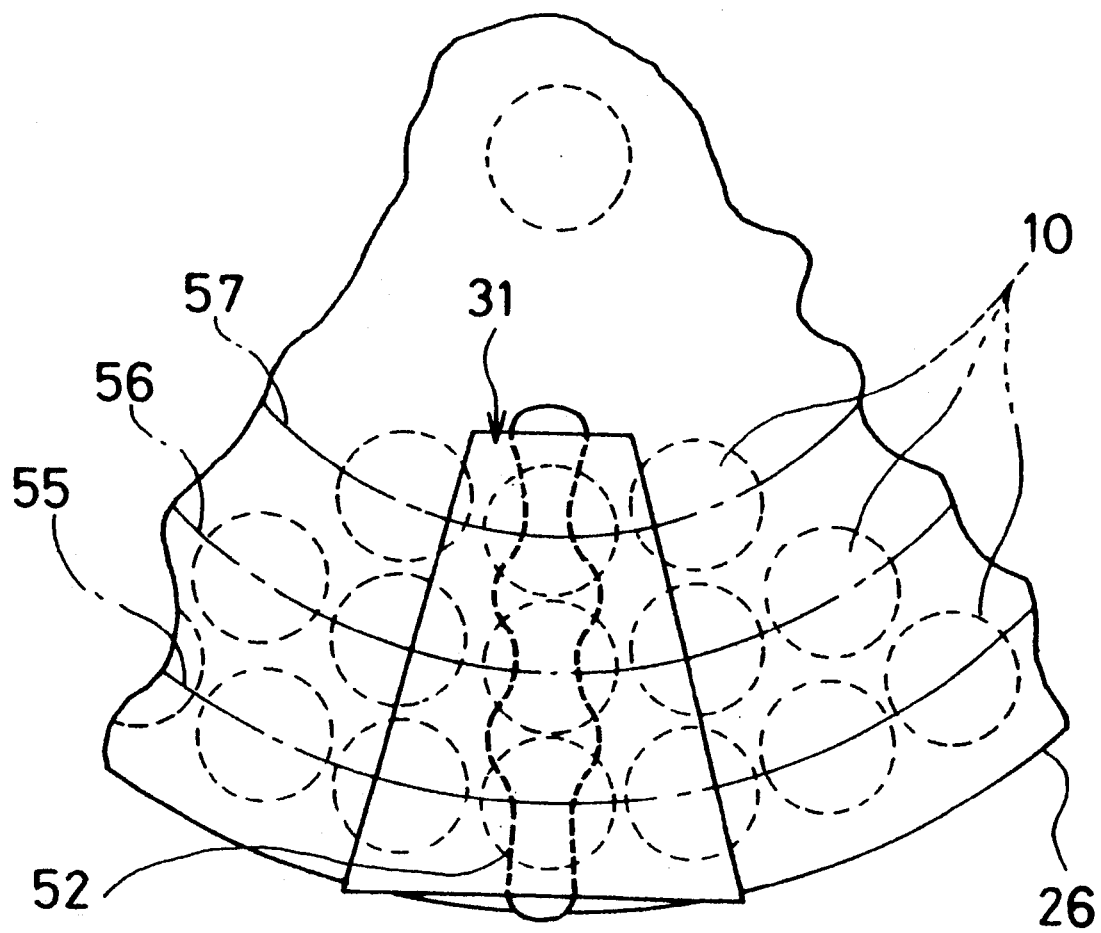
FIG. 9 is a plan view showing a planar shape of the lower thickness correcting plate.
Figure 10:
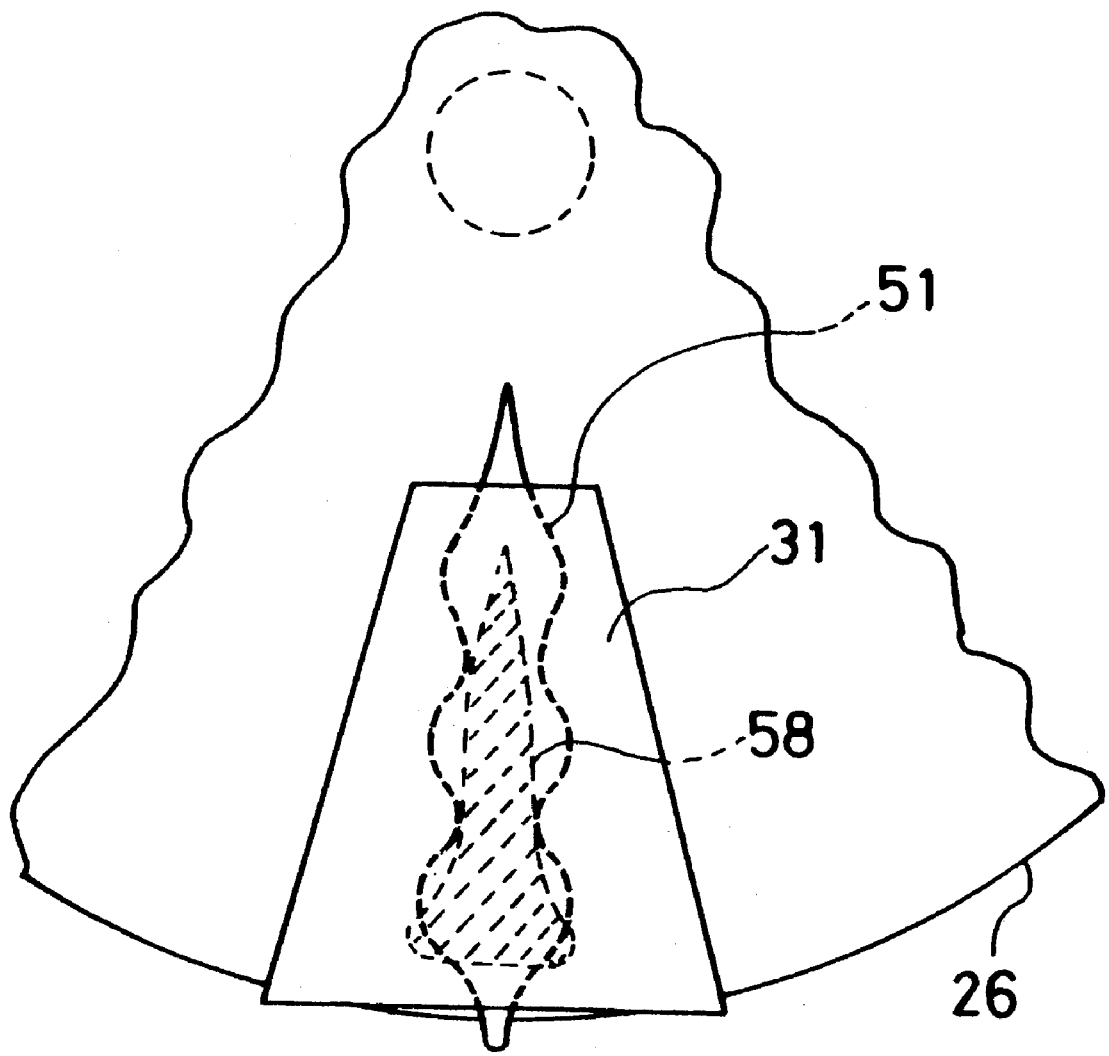
FIG. 10 is a diagram showing an non-erosion part in the target.

The plurality of plastic base materials 10 are disposed on concentric circles 55, 56 and 57 in the substrate holder 26 as shown in FIG. 8. The three concentric circles are utilized in the present embodiment. Further, as it is apparent from FIGS. 8 and 9, the planar shape of the upper and lower targets 31 preferably have a trapezoidal shape having a short edge at the center side and a long edge at the peripheral side.

The above-mentioned thickness correcting plate 51 having the planar shape as shown in FIG. 8 is disposed between the upper target 31 and the plurality of plastic base materials 10 set on the substrate holder 26 in the arrangement as described above. The thickness correcting plate 51 is disposed so that its longitudinal direction is oriented to the direction (the radial direction) of a straight line connecting the center part and the peripheral part in the substrate holder 26. In the thickness correcting plate 51, preferably, length in the circumferential direction of devices corresponding to the concentric circles 55–57 (where the plastic base materials are disposed or present) is longer than length in the circumferential direction of the other devices, and further the length of the devices corresponding to the concentric circles 55–57 in the thickness correcting plate 51 is set so as to become small gradually from the peripheral part to the center part. Thereby, a predetermined range of the upper faces (concave surfaces) of the plastic base materials 10 which have come to the position facing almost to the center part of the upper target 31 by the rotatable substrate holder 26 are covered by the thickness correcting plate 51. As a result, the thickness of the thin film deposited on the upper faces (concave surfaces) of the plastic base materials 10 are equalized, because they are corrected by the masking action of the thickness correcting plate 51. It is noted that the planar shape of the thickness correcting plate 51 is not limited only to that shown in FIG. 8.

Similarly, the above-mentioned thickness correcting plate 52 having the planar shape as shown in FIG. 9 is disposed between the lower target 31 and the plurality of plastic base materials 10 the substrate holder 26. The thickness correcting plate 52 is disposed so that its longitudinal direction is oriented to in the direction (the radial direction) of a straight line connecting the center part and the peripheral part in the substrate holder 26, and preferably, length in the circumferential direction of parts corresponding to the intermediate portions of the concentric circles 55–57 (boundaries between the plastic base materials) is longer than length in the circumferential direction of the other parts. Thereby, a predetermined range of the lower faces (convex surfaces) of the plastic base materials 10 which have come to the position facing almost to the center part of the lower target 31 by the rotatable substrate holder 26 are covered by the thickness correcting plate 52. As a result, the thickness of the thin film deposited on the lower faces (convex surfaces) of the plastic base materials 10 are equalized, because they are corrected by the masking action of the thickness correcting plate 52. It is noted that the planar shape of the thickness correcting plate 52 is not limited only to that shown in FIG. 9.

In another point of view, the thickness correcting plates 51 and 52 function as the mask members having the following actions. That is, the target 31 having the trapezoidal shape is normally provided with a peculiar magnet structure (not shown) and creates an non-erosion part 58 similar to the shape of isosceles triangle at the center part of the target according to the film deposition action based on the sputtering. When such non-erosion part 58 exists on the target 31, abnormal discharge is liable to occur due to reaction products deposited on the target surface in the non-erosion part 58. As a result, the reaction products fly as particles from the non-erosion part 58 and arrive and adhere on the surface of the plastic base material 10. However, because the thickness correcting plates 51 and 52 are disposed between the substrate holder 26 and the upper and lower targets 31 as described above in the above-mentioned sputtering film deposition system so that the thickness correcting plates cover the plastic base materials 10 facing to the targets, they interfere the particles flying from the non-erosion part 58 and prevent the particles from arriving to the surfaces of the plastic base materials 10.

The above-mentioned thickness correcting mechanism allows the thickness of the thin film on the surface of the optical lens base material to be equalized and the favorable distribution of thickness to be realized in depositing the thin films on the both sides or on one side of the optical lens base material by the sputtering film deposition system by using the sputtering method. Further, the thickness correcting plates allow the particles flying from the non-erosion portion of the targets to be interfered.

INDUSTRIAL APPLICABILITY

The present invention is suitable for coating the antireflection film having the highly evaluated film performance on the plastic optical devices. The antireflection film is formed as a wide band film and reduces the non-uniformity of interference color caused by the difference of distribution of thickness and the change in the interference color caused by oblique incidence when the plastic base material has curvature. The present invention allows the greenish interference color to be obtained stably and the antireflection film which is excellent eye-physiologically and aesthetically and is highly valuable commercially to be fabricated. In case of the spectacles plastic lens, the super-thin film of $SiO_{(2-x)}$ prevents cracks from occurring on the antireflection film as the pre-treatment layer. The thickness correcting plates of the thickness correcting mechanism equalize the thickness of the thin film Asdeposited on the surface of the plastic base material by the sputtering method.

What is claimed is:

1. Plastic optical devices in which an antireflection film (13) is coated at least on one surface of a plastic base material (10), characterized in that said antireflection film (13) is a multi-layered film which is formed by depositing a first layer (131) on the side of said plastic base material substantially by a high-refractive material and the next layer (132) by a low-refractive material and by alternately laminating those high-refractive materials and low-refractive materials, whose dominant wavelength range is 480 to 550 nm, excitation purity range is 10 to 30% and luminous reflectance is 0.7 to 1.8%, and which has a greenish interference color.

2. The plastic optical devices of claim 1, wherein:
    the thickness of said low-refractive material positioned in the intermediate area of said multi-layered film is relatively thickened so that required hardness and durability can be obtained.

3. The plastic optical devices having the antireflection film according to claim 1, characterized in that said high-refractive material is metal oxide deposited by a sputtering method by using a target made from any one of Zr, Ti and Ta or from alloys of two or more of those and said low-refractive material is metal oxide deposited by the sputtering method by using a target of Si.

4. The plastic optical devices having the antireflection film according to claim 3, characterized in that said target of said high-refractive material contains Si.

5. The plastic optical devices having the antireflection film according to claim 3, characterized in that a target of Si is provided beside said target of said high-refractive material when depositing said high-refractive material in order to deposit said high-refractive material as a mixed film by sputtering said two kinds of targets in the same time.

6. The plastic optical devices having the antireflection film according to claim 1, characterized in that the total thickness of said antireflection film is included within the range of 4800 to 5800 angstrom and the total thickness of said low-refractive materials therein is 3500 angstrom or more.

7. The plastic optical devices having the antireflection film according to claim 1, characterized in that when said plastic base material has curvature, said antireflection film is formed as a wide band film to reduce non-uniformity of interference color caused by a difference of distribution of thickness dependent on the curvature in depositing the film by the sputtering method and change of interference color caused by oblique incidence.

8. The plastic optical devices having the antireflection film according to claim 1, characterized in that said plastic base material is a base material of an spectacles plastic lens and said antireflection film is formed on the both sides of said plastic base material.

9. The plastic optical devices having the antireflection film according to claim 1, characterized in that said antireflection film is composed of ten layers and the thickness of said low-refractive material at the sixth layer (136) positioned at the middle is increased.

10. A spectacle plastic lens having an antireflection film in which said antireflection film is coated on a plastic base material by using a sputtering method, characterized in that:
    said antireflection film is a multi-layered film which is formed by depositing a first layer on the side of said plastic base material by a high-refractive material and the next layer by a low-refractive material and by alternately laminating those high-refractive materials and low refractive materials; and
    a super-thin film of $SiO_{(2-x)}$ is deposited as a pre-treatment layer on said plastic base material, the thickness of said super-thin film is within the range of 15 to 50 angstrom.

11. The spectacles plastic lens having the antireflection film according to claim 10, characterized in that said high-refractive material is metal oxide deposited by a sputtering method by using a target made from any one of Zr, Ti and Ta or from alloys of two or more of those and said low-refractive material is metal oxide deposited by the sputtering method by using a target of Si.

12. The spectacles plastic lens having the antireflection film according to claim 11, characterized in that said target of said high-refractive material contains Si.

13. The spectacles plastic lens having the antireflection film according to claim 11, characterized in that a target of Si is provided beside said target of said high-refractive material when depositing said high-refractive material in order to deposit said high-refractive material as a mixed film by sputtering said two kinds of targets in the same time.

14. The spectacles plastic lens having the antireflection film according to claim 10, characterized in that said antireflection film is composed of ten layers and the thickness of said low-refractive material at the sixth layer (136) positioned at the middle is increased.

15. A thickness correcting mechanism for sputtering film deposition, used in a film deposition system for depositing a thin film on the surface of an optical lens base material (10) by a sputtering method, characterized in that it comprises thickness correcting plates for correcting the difference of thickness of said thin film.

16. The thickness correcting mechanism for sputtering film deposition according to claim 15, characterized in that:
the surface of said optical lens base material (10) has curvature and a plurality of said optical lens base materials (10) are disposed horizontally at the positions of concentric circles in a circular plate holder (26) which is placed horizontally and is rotatable;
said film deposition system comprises targets (31) facing to the surfaces of said optical lens bass materials (10); and
said thickness correcting plates are mask members (51, 52) for regulating the difference of film thickness, which are disposed in the direction connecting the peripheral part and the center part in said holder, and between said targets (31) and said holder (26).

17. The thickness correcting mechanism for sputtering film deposition according to claim 16, characterized in that:
said targets (31) are composed of upper and lower targets facing respectively to the both sides of said optical lens base material (10); and
said mask members are composed of the mask member (51) for a concave surface disposed between said upper target (31) and said holder (26) and the mask member (52) for a convex surface disposed between said lower target (31) and said holder (26).

18. The thickness correcting mechanism for sputtering film deposition according to claim 17, characterized in that in said mask member (51) for the concave surface, the size in the circumferential direction of the parts corresponding to the positions where said optical lens base materials exist is greater than the size in the circumferential direction of the other parts, and that in the mask member (52) for the convex surface, the size in the circumferential direction of the parts corresponding to the positions where boundaries between said optical lens base materials exist is greater than the size in the circumferential direction of the other parts.

19. The thickness correcting mechanism for sputtering according claim 16, characterized in that said mask members (51, 52) interfere particles flying from non-erosion portions created in said targets (31).

* * * * *